United States Patent [19]

Enami

[11] Patent Number: 4,572,995
[45] Date of Patent: Feb. 25, 1986

[54] SYNCHRONISM DISCRIMINATING CIRCUIT

[75] Inventor: Ken Enami, Fujieda, Japan

[73] Assignee: Victor Company of Japan, Ltd., Yokohama, Japan

[21] Appl. No.: 638,867

[22] Filed: Aug. 8, 1984

[30] Foreign Application Priority Data

Aug. 26, 1983 [JP] Japan ................................ 58-155774

[51] Int. Cl.⁴ .............................................. H02P 5/16
[52] U.S. Cl. .................................... 318/314; 318/341; 318/599; 318/606
[58] Field of Search ............... 318/311, 312, 314, 315, 318/317, 318, 326, 327, 345 A345 E, 341, 599, 600, 636, 601, 654, 603, 604, 655, 606, 683, 607, 684, 608, 615, 685, 616, 437, 617, 490, 618; 329/110, 112, 104; 307/510–517, 524–528; 328/133, 134; 324/160, 161, 163

[56] References Cited

U.S. PATENT DOCUMENTS

| | | | |
|---|---|---|---|
| 3,110,853 | 11/1963 | Jones | 318/314 |
| 3,753,067 | 8/1973 | Milligan | 318/314 |
| 3,934,269 | 1/1976 | Fujita et al. | 318/314 X |
| 3,956,710 | 5/1976 | Seitz et al. | 307/511 |
| 4,211,967 | 7/1980 | Akiyama et al. | 318/490 |
| 4,243,921 | 1/1981 | Tamura et al. | 318/314 |
| 4,272,712 | 6/1981 | Beling et al. | 318/608 X |
| 4,355,266 | 10/1982 | Pearson | 318/314 X |
| 4,376,914 | 3/1983 | Kimura | 318/607 X |
| 4,386,300 | 5/1983 | Ogawa | 318/314 |

FOREIGN PATENT DOCUMENTS

| | | |
|---|---|---|
| 34310215 | 8/1984 | Fed. Rep. of Germany . |
| 155774 | of 1983 | Japan . |
| 8421077 | 8/1984 | United Kingdom . |

OTHER PUBLICATIONS

US Journal: IEEE, Transactions on Instrumentation and Measurement, vol. IM-26 No. 2, Jun. 1977, pp. 153–157.

Primary Examiner—William M. Shoop, Jr.
Assistant Examiner—Shik Luen Paul Ip
Attorney, Agent, or Firm—Ladas & Parry

[57] ABSTRACT

A synchronism discriminating circuit comprises a phase comparator supplied with a reference signal having a reference frequency and a reference phase and with an input signal of which a synchronism with respect to the reference signal is to be discriminated, for comparing the phase of the reference signal with the phase of the input signal and for producing an output signal responsive to a phase difference between the two signals, where the reference signal is made up of a series of pulses, and a discriminating circuit supplied with the reference signal and with the output signal of the phase comparator, for counting the pulses in the reference signal during a period in which the phase difference is within a predetermined range and for producing a synchronism discrimination signal when a predetermined number or more pulses in the reference signal are continuously counted.

9 Claims, 20 Drawing Figures

SYNCHRONISM DISCRIMINATING CIRCUIT

BACKGROUND OF THE INVENTION

The present invention generally relates to synchronism discriminating circuits, and more particularly to a synchronism discriminating circuit which accurately discriminates whether phases of two input signals are within a predetermined synchronous range, without making an erroneous discrimination.

Generally, a rotation control system for rotating a motor in synchronism with a reference signal, is designed to compare the phase of the reference signal with the phase of a signal which is obtained by detecting the rotation of the motor by use of a frequency generator, for example. The rotation of the motor is controlled responsive to an error output which is obtained as a result of the phase comparison.

However, at an initial stage of the motor rotation, for example, the rotational speed of the motor does not reach a predetermined rotational speed, and the motor does not rotate in synchronism with the reference signal. Hence, it is necessary in some cases to detect whether the rotation of the motor is pulled into synchronism with the reference signal. A synchronism discriminating circuit is employed in such cases, to discriminate whether the motor rotates in synchronism with the reference signal. By employing such a synchronism discriminating circuit, it is possible to detect an asynchronous state while the motor rotates, when the rotation of the motor becomes out of synchronism with the reference signal due to some cause.

As will be described later on in the specification in conjunction with the drawings, a conventional synchronism discriminating circuit had a disadvantage in that the circuit may erroneously discriminate that the motor is undergoing a synchronous rotation even when the motor rotates out of synchronism.

SUMMARY OF THE INVENTION

Accordingly, it is a general object of the present invention to provide a novel and useful synchronism discriminating circuit in which the above described disadvantage is eliminated.

Another and more specific object of the present invention is to provide a synchronism discriminating circuit which is designed to produce a synchronism discrimination signal when a synchronous state is continuously detected for a predetermined period. According to the synchronism discriminating circuit of the present invention, the synchronism discrimination signal will not be produced even when a synchronous state is detected for a short period in an asynchronous state. Thus, it is possible to accurately discriminate the synchronous state.

Other objects and further features of the present invention will be apparent from the following detailed description when read in conjunction with the accompanying drawings.

DETAILED DESCRIPTION

Figure 1:
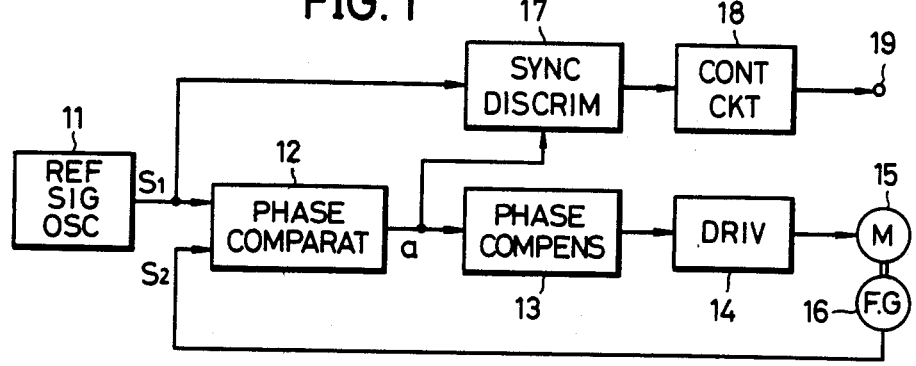
FIG. 1 is a system block diagram showing an example of a general motor control system which may be applied with a synchronism discriminating circuit according to the present invention.

First, description will be given with respect to an example of a general motor control system which may be applied with a synchronism discriminating circuit according to the present invention, by referring to FIG. 1. In FIG. 1, a reference signal $S_1$ from a reference signal oscillator 11 which is made up of a crystal oscillator, is supplied to a phase comparator 12. The reference signal $S_1$ is made up of a series of pulses. The rotation of a motor 15 is detected by a frequency generator 16, and an output signal $S_2$ of the frequency generator 16 is supplied to the phase comparator 12. The phase comparator 12 compares the phase of the reference signal $S_1$ with the phase of the signal $S_2$. An output phase error signal a of the phase comparator 12 is supplied to a phase compensation circuit 13 wherein the phase of the phase error signal a is compensated, and an output signal of the phase compensation circuit 13 is supplied to a driving circuit 14. The motor 15 is driven responsive to an output signal of the driving circuit 14. Accordingly, the rotation of the motor 15 is controlled so that the motor 15 rotates in phase synchronism with the reference signal $S_1$.

On the other hand, the output reference signal $S_1$ of the reference signal oscillator 11 and the output phase error signal a of the phase comparator 12, are supplied to a synchronism discriminating circuit 17. The synchronism discriminating circuit 17 discriminates whether the signals $S_1$ and $S_2$ are in synchronism. An output synchronism discrimination signal of the synchronism discriminating circuit 17 is supplied to a control circuit 18. An output signal of the control circuit 18 is supplied to a predetermined circuit or mechanism, through an output terminal 19. For example, when the motor control system shown in FIG. 1 is applied to a reproducing apparatus for playing an electrostatic capacitance type disc which is recorded with a video signal, the synchronism discriminating circuit 17 discriminates whether the motor 15 has reached a synchronous rotation with the reference signal $S_1$ after the motor 15 is started, when starting a reproducing operation of the reproducing apparatus. When the synchronism discriminating circuit 17 discriminates that the motor 15 is rotating in synchronism with the reference signal $S_1$, the control circuit 18 produces a control signal in response to the output synchronism discrimination signal of the synchronism discriminating circuit 17, so as to lower a pickup reproducing stylus on the disc in response to the control signal. The pickup reproducing stylus reproduces the recorded signals from the disc.

Figure 2:
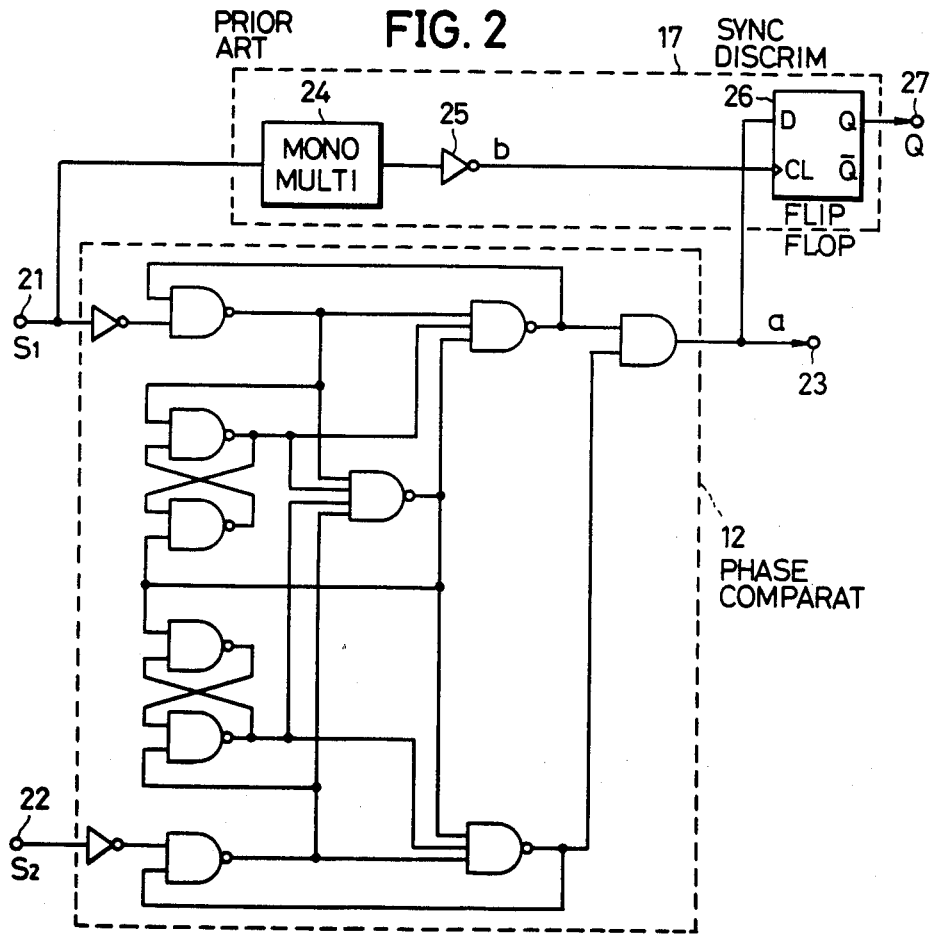
FIG. 2 is a system circuit diagram showing an example of a conventional synchronism discriminating circuit.

An example of a conventional phase comparator 12 and a conventional synchronism discriminating circuit 17, are shown in FIG. 2. In FIG. 2, the output reference signal $S_1$ of the reference signal oscillator 11 is applied to a terminal 21. The reference signal $S_1$ is supplied to the known phase comparator 12 comprising inverters, NAND gates, and AND gates which are coupled as shown in FIG. 2. In addition, the reference signal $S_1$ is supplied to a monostable multivibrator 24 of the conventional synchronism discriminating circuit 17. The output signal $S_2$ of the frequency generator 16 is supplied to the phase comparator 12 through a terminal 22. In a case where the signal $S_2$ has the phase shown in FIG. 3(B) with respect to the reference signal $S_1$ shown in FIG. 3(A), the phase comparator 12 produces the phase error signal a shown in FIG. 3(C) which assumes a high level between rising edges of the signals $S_1$ and $S_2$. The phase error signal a is supplied to the phase compensation circuit 12 through an output terminal 23. Further, the phase error signal a is supplied to a data terminal of a D-type flip-flop 26 of the synchronism discriminating circuit 17.

Figure 3:
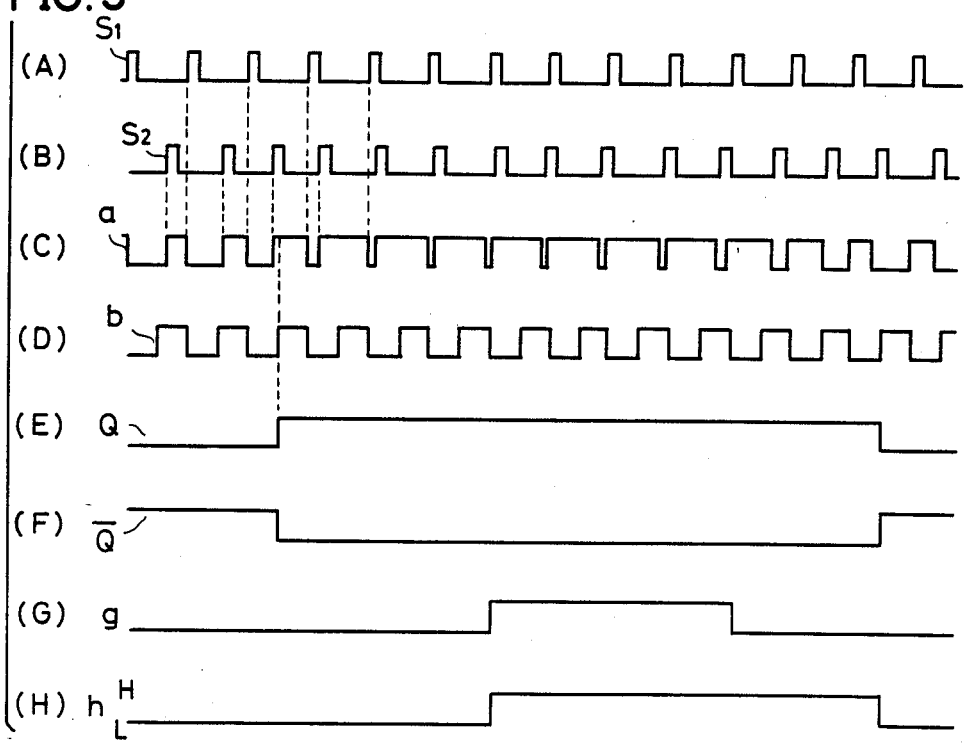
FIGS. 3(A) through 3(H) and FIGS. 4(A) through 4(G) respectively are signal time charts for explaining operations of the conventional synchronism discriminating circuit and the synchronism discriminating circuit according to the present invention in a state where a motor undergoes a synchronous rotation and in a state where the motor undergoes an asynchronous rotation.

The monostable multivibrator 24 is triggered responsive to a rising edge of the reference signal $S_1$, and produces a signal having a duty ratio of 1/2. The output signal of the monostable multivibrator 24 is inverted by an inverter 25 into a signal b shown in FIG. 3(D). This signal b is applied to a clock terminal of the flip-flop 26. An output signal Q shown in FIG. 3(E) is produced through a Q-output terminal of the flip-flop 26. As shown in FIG. 3(E), the signal Q assumes a high level from a time when a rising edge of the signal b corresponds to a high level of the signal a to a time when a subsequent rising edge of the signal b first corresponds to a low level of the signal a. The signal Q is supplied to the control circuit 18 through a terminal 27. During a high-level period of the signal Q, the phase difference between the signals $S_1$ and $S_2$ is within a predetermined range, and the signals $S_1$ and $S_2$ are essentially in synchronism. On the other hand, during a low-level period of the signal Q, the phase difference between the signals $S_1$ and $S_2$ are out of the predetermined range, and the signals $S_1$ and $S_2$ are greatly out of synchronism.

As the motor 15 starts to rotate, the rotational speed of the motor 15 is slow, and the rotation of the motor 15 is greatly out of synchronism. In such a case where the rotation of the motor 15 is greatly out of synchronism, the output signal $S_2$ of the frequency generator 16 assumes a waveform shown in FIG. 4(B), and the frequency of the signal $S_2$ also greatly differs from the frequency of the reference signal $S_1$ shown in FIG. 4(A). In this case, the output phase error signal a of the phase comparator 12 assumes a waveform shown in FIG. 4(C). The signal b applied to the clock terminal of the flip-flop 26 assumes a waveform shown in FIG. 4(D). The signals $S_1$ and b shown in FIGS. 4(A) and 4(D), are the same as the signals $S_1$ and b shown in FIGS. 3(A) and 3(D). In this state, the signal Q shown in FIG. 4(E) is obtained from the Q-output terminal of the flip-flop 26.

Figure 4:
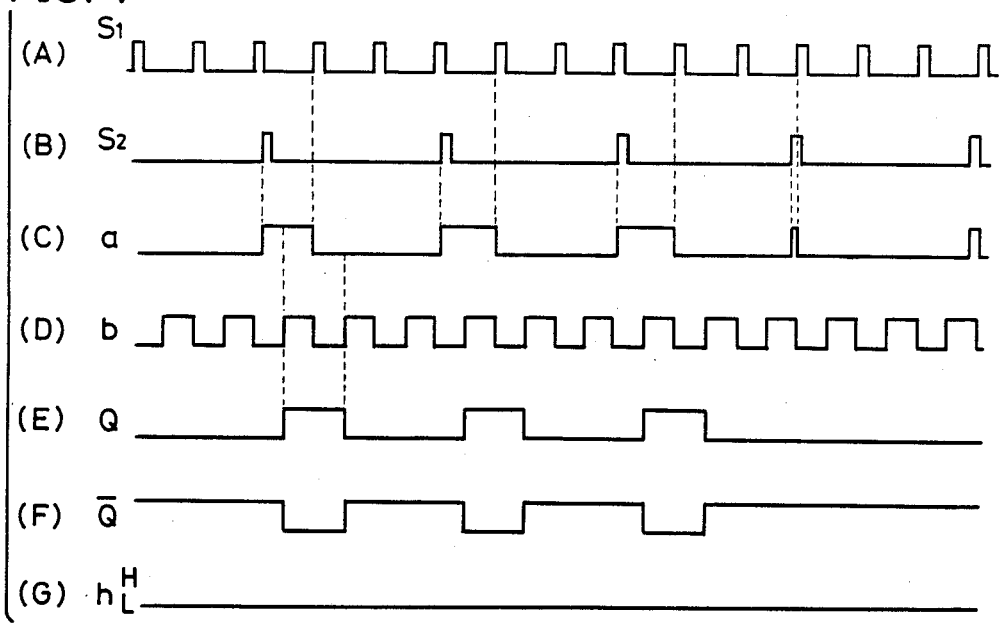

As may be seen from FIGS. 4(C) through 4(E), the signal Q assumes a high level from a time when a rising edge of the signal b corresponds to a high level of the signal a to a time when a subsequent rising edge of the signal b first corresponds to a low level of the signal a. The high-level period of the signal Q, indicates the period in which the motor 15 rotates in synchronism. For this reason, in a case where the signals $S_1$ and $S_2$ are not in synchronism but a high-level period exists in the signal Q, the synchronism discriminating circuit 17 will erroneously discriminate that the motor 15 is rotating in synchronism, and the output synchronism discrimination signal of the synchronism discriminating circuit 17 will be in error. Therefore, this conventional synchronism discriminating circuit is disadvantageous in that the synchronous state cannot be detected accurately.

Figure 5:
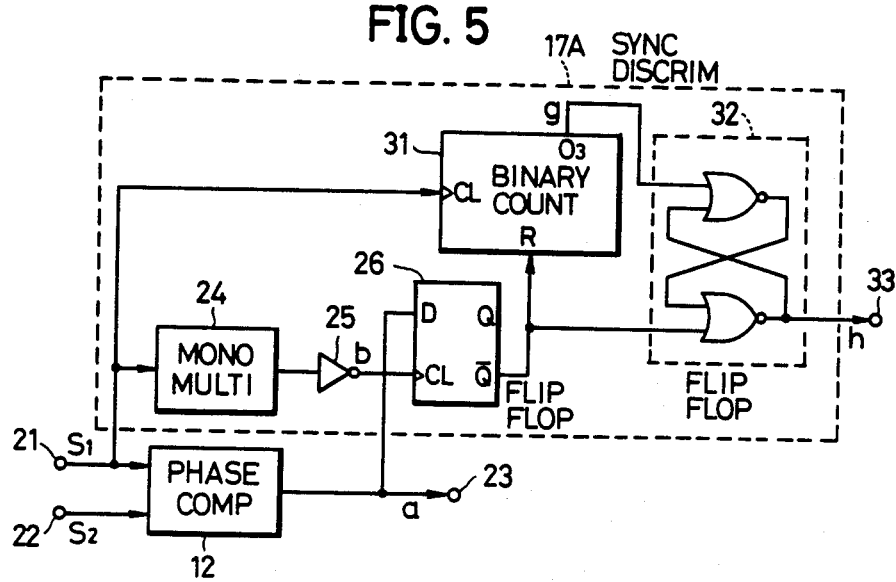
FIG. 5 is a system circuit diagram showing an embodiment of the synchronism discriminating circuit according to the present invention.

The present invention has eliminated the disadvantage of the conventional synchronism discriminating circuit described heretofore, and an embodiment of the synchronism discriminating circuit according to the present invention will now be described by referring to FIG. 5. In FIG. 5, those parts which are the same as those corresponding parts in FIG. 2 will be designated by the same reference numerals, and their description will be omitted. In FIG. 5, the reference signal $S_1$ applied to the terminal 21, is supplied to the phase comparator 12. The reference signal $S_1$ is also supplied to the monostable multivibrator 24 and to a clock terminal of a binary counter 31 which are located within a synchronism discriminating circuit 17A. The output signal a of the phase comparator 12 is applied to the data terminal of the flip-flop 26. The output signal of the monostable multivibrator 24 is applied to the clock terminal of the flip-flop 26, through the inverter 25. When the signals $S_1$ and $S_2$ are in the phase relationship shown in FIGS. 3(A) and 3(B), a signal $\overline{Q}$ shown in FIG. 3(F) is produced through a $\overline{Q}$-output terminal of the flip-flop 26. The phase of the signal $\overline{Q}$ is inverted with respect to the phase of the signal Q which is produced through the Q-output terminal of the flip-flop 26. On the other hand, when the signals $S_1$ and $S_2$ are in the phase relationship shown in FIGS. 4(A) and 4(B), the signal $\overline{Q}$ shown in FIG. 4(F) is produced through the $\overline{Q}$-output terminal of the flip-flop 26. The output signal $\overline{Q}$ of the flip-flop 26 is supplied to a reset terminal of the binary counter 31.

For example, a signal produced through a third-stage output terminal $O_3$ of the binary counter 31, is supplied to a flip-flop 32 which is made up of NOR gates, as an output signal of the binary counter 31. The binary counter 31 is reset responsive to a falling edge of the signal $\overline{Q}$ which is received from the flip-flop 26. Thereafter, the binary counter 31 produces a signal g shown in FIG. 3(G). The signal g assumes a high level when the binary counter 31 counts $2^{3-1}=4$ pulses in the reference signal $S_1$ which is received through the terminal 21, and assumes a low level when the binary counter 31 further counts 4 pulses in the reference signal $S_1$.

The output signal g of the binary counter 31 is applied to one input terminal of the flip-flop 32, and the output signal $\overline{Q}$ of the flip-flop 26 is applied to the other input terminal of the flip-flop 32. Accordingly, the flip-flop 32 produces a signal h shown in FIG. 3(H) which rises responsive to a rising edge of the signal g. The output signal h of the flip-flop 32 is passed through a terminal 33, and is supplied to the control circuit 18 as the output synchronism discrimination signal of the synchronism discriminating circuit 17A.

When the phase error of the signal $S_2$ with respect to the phase of the reference signal $S_1$ thereafter goes out of the predetermined range and the rotation of the motor 15 runs out of synchronism, the output signal $\overline{Q}$ of the flip-flop 26 rises. As a result, the flip-flop 32 is reset, and the output signal h falls.

According to the present embodiment of the synchronism discriminating circuit, the signal g is produced after the binary counter 31 is reset responsive to the output signal $\overline{Q}$ of the flip-flop 26, and after the binary counter 31 counts 4 pulses in the reference signal $S_1$. Thus, the signal h is produced responsive to the production of the signal g. On the other hand, when the signal $S_2$ is out of synchronism with respect to the reference signal $S_1$ as shown in FIGS. 4(A) and 4(B), as in the case where the motor 15 starts to rotate, for example, the output signal $\overline{Q}$ of the flip-flop 26 once falls and thereafter rises within a relatively short time as shown in FIG. 4(F). For this reason, after the binary counter 31 is reset responsive to the signal $\overline{Q}$ and before the binary counter 31 counts 4 pulses in the reference signal $S_1$ and produces the signal g, the flip-flop 32 is reset responsive to the rising edge of the signal $\overline{Q}$. Hence, the output signal h of the flip-flop 32 remains at low level as shown in FIG. 4(G). Accordingly, even when the flip-flop 26 produces a signal $\overline{Q}$ having a period (duration) shorter than the period which is required for the binary counter 31 to count 4 pulses in the reference signal $S_1$, no synchronism discrimination signal is produced through the output terminal 33. Consequently, even when the flip-flop 26 produces a signal $\overline{Q}$ having a short period (duration), the synchronism discriminating circuit 17A will not produce a synchronism discrimination signal.

A known circuit can be used for the binary counter 31. For example, a 12-bit binary counter (for example, a counter HD14040B manufactured by Hitachi Ltd. of Japan) which is made up of an input wave shaping circuit and a 12-stage ripple carry binary counter, may be used for the binary counter 31, and the third-stage output terminal $O_3$ is utilized in the embodiment described heretofore. The number of counts the binary counter 31 makes when producing the synchronism discrimination signal, is not limited to 4. For example, the number of counts the binary counter 31 makes may be 8, 16, or the like, and in these cases, a fourth-stage output terminal $O_4$, a fifth-stage output terminal $O_5$, or the like of the binary counter 31 are utilized.

Figure 6A:
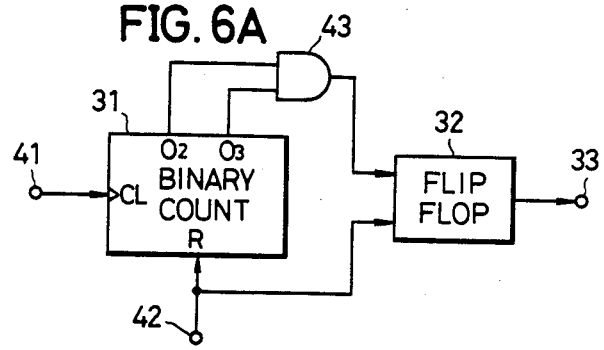
FIGS. 6A and 6B are system circuit diagrams respectively showing essential parts of modifications of the synchronism discriminating circuit according to the present invention.
Figure 6B:
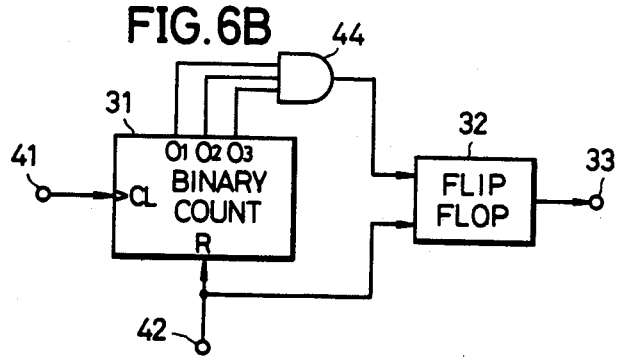

In addition, the number of counts the binary counter 31 makes when producing the synchronism discrimination signal, is not limited to $2^N$, where N is an integer, and may be other numbers. When the number of counts in the binary counter 31 is set to a number other than $2^N$, circuits shown in FIGS. 6A and 6B are employed. In the modification shown in FIG. 6A, the reference signal $S_1$ from the terminal 21 is applied to the binary counter 31 through a terminal 41. The output signal $\overline{Q}$ of the flip-flop 26 is applied to the reset terminal of the binary counter 31 through a terminal 42. Signals produced through second-stage and third-stage output terminals $O_2$ and $O_3$ of the binary counter 31, are respectively supplied to respective input terminals of a 2-input AND gate 43. An output signal of the AND gate 43 is applied to one input terminal of the flip-flop 32. The signal $\overline{Q}$ from the terminal 42, is applied to the other input terminal of the flip-flop 32. According to this modification, the synchronism discrimination signal is produced from the flip-flop 32 when the binary counter 31 counts $2^{3-1}+2^{2-1}=6$ pulses in the reference signal $S_1$.

In the modification shown in FIG. 6B, signals produced through first-stage, second-stage, and third-stage output terminals $O_1$, $O_2$, and $O_3$ of the binary counter 31 are supplied to respective input terminals of a 3-input AND gate 44. An output signal of the AND gate 44 is applied to one input terminal of the flip-flop 32. According to this modification, the flip-flop 32 produces the synchronism discrimination signal when the binary counter 31 counts $2^{3-1}+2^{2-1}+2^{1-1}=7$ pulses in the reference signal $S_1$.

Further, the present invention is not limited to these embodiments, but various variations and modifications may be made without departing from the scope of the present invention.

What is claimed is:

1. A synchronism discriminating circuit comprising:
   phase comparator means supplied with a reference signal having a reference frequency and a reference phase and with an input signal of which a synchronism with respect to said reference signal is to be discriminated, for comparing the phase of said reference signal with the phase of said input signal and for producing an output signal responsive to a phase difference between the two signals, said reference signal being made up of a series of pulses; and
   synchronization detecting circuit means supplied with said reference signal and with the output signal of said phase comparator means, for producing a sychronism detection signal, said synchronization detecting circuit means counting the pulses in said reference signal during a period in which said phase difference is within a predetermined range and producing said synchronism detection signal when at least a predetermined number of pulses in said reference signal are continuously counted.

2. A synchronism discriminating circuit as claimed in claim 1 in which said discriminating means comprises a reference pulse width generating means supplied with said reference signal and triggered in response responsive to said reference signal, a first flip-flop having a data terminal supplied with the output signal of said phase comparator means and having a clock terminal supplied with an output signal of said reference pulse width generating means, and a binary counter having a clock terminal supplied with said reference signal and having a reset terminal supplied with an output signal of said first flip-flop, said binary counter producing said synchronism discrimination signal through a predetermined output terminal thereof.

3. A synchronism discriminating circuit as claimed in claim 2 in which said synchronization detecting circuit means further comprises a second flip-flop supplied with output signals of said binary counter and said first flip-flop, for producing said synchronism detection signal.

4. A synchronism discriminating circuit as claimed in claim 3 in which said synchronization dectecting circuit means further comprises an AND gate supplied with signals produced through a plurality of
   counter, for supplying an output output terminals of said binary counter, for supplying an output signal to said second flip-flop.

5. A synchronism discriminating circuit as claimed in claim 2 in which said synchronization detecting circuit means further comprises an inverter for inverting the phase of the output signal of said reference pulse width generating means and for supplying an output signal to said first flip-flop, said first flip-flop supplying a Q-output to the reset terminal of said binary counter.

6. A synchronism discriminating circuit as claimed in claim 2 in which said reference pulse width generating means comprises a monostable multivibrator.

7. A synchronism discriminating circuit as claimed in claim 3 in which said reference pulse width generating means comprises a monostable multivibrator.

8. A synchronism discriminating circuit as claimed in claim 4 in which said reference pulse width generating means comprises a monostable multivibrator.

9. A synchronism discriminating circuit as claimed in claim 5 in which said reference pulse width generating means comprises a monostable multivibrator.

* * * * *